US008584830B2

(12) United States Patent
Heigl et al.

(10) Patent No.: US 8,584,830 B2
(45) Date of Patent: Nov. 19, 2013

(54) TRANSPORT ASSEMBLY

(76) Inventors: Hubertus Heigl, Munich (DE);
Helmuth Heigl, Kolbermoor (DE)

(*) Notice: Subject to any disclaimer, the term of this patent is extended or adjusted under 35 U.S.C. 154(b) by 998 days.

(21) Appl. No.: 11/972,348

(22) Filed: Jan. 10, 2008

(65) Prior Publication Data
US 2008/0170930 A1 Jul. 17, 2008

(30) Foreign Application Priority Data
Jan. 11, 2007 (DE) .......................... 10 2007 001 722

(51) Int. Cl.
*B65G 17/46* (2006.01)

(52) U.S. Cl.
USPC ................... 198/471.1; 198/750.12; 198/890; 414/223.02

(58) Field of Classification Search
USPC ................... 198/471.1, 428, 750.12, 890; 414/223.01, 223.02
See application file for complete search history.

(56) References Cited

U.S. PATENT DOCUMENTS

| 1,243,406 | A | * | 10/1917 | Hawthorne ...................... 53/539 |
| 2,907,858 | A | * | 10/1959 | Distler ........................... 219/650 |
| 3,386,558 | A | * | 6/1968 | Benatar .......................... 198/408 |
| 3,628,451 | A | * | 12/1971 | McClellan et al. ................ 101/4 |
| 3,716,134 | A | * | 2/1973 | Campbell ...................... 209/563 |
| 3,750,878 | A | * | 8/1973 | Atchley et al. ................. 209/560 |
| 4,050,574 | A | * | 9/1977 | Chenevard et al. ........... 198/458 |
| 4,506,779 | A | * | 3/1985 | Seragnoli .................... 198/459.1 |
| 4,614,018 | A | * | 9/1986 | Krall .............................. 29/33 J |
| 4,645,063 | A | * | 2/1987 | Seragnoli ....................... 198/450 |
| 4,901,843 | A | * | 2/1990 | Lashyro ...................... 198/418.3 |
| 5,022,511 | A | * | 6/1991 | Gorrieri et al. ............ 198/460.1 |
| 5,085,312 | A | * | 2/1992 | Ribordy et al. ............ 198/463.4 |
| 5,105,931 | A | * | 4/1992 | Lashyro ..................... 198/471.1 |
| 5,313,401 | A |   | 5/1994 | Kasai et al. |
| 5,336,029 | A | * | 8/1994 | Kato et al. ..................... 414/217 |
| 5,421,447 | A | * | 6/1995 | Ruth et al. .................. 198/377.1 |
| 5,456,570 | A | * | 10/1995 | Davis et al. .................... 414/742 |
| 5,469,953 | A | * | 11/1995 | Igarashi et al. ............ 198/345.2 |
| 5,921,375 | A | * | 7/1999 | van Laar .................... 198/471.1 |

(Continued)

FOREIGN PATENT DOCUMENTS

DE 3812202 10/1989
DE 19827458 3/2000

(Continued)

*Primary Examiner* — Joseph Dillon, Jr.
(74) *Attorney, Agent, or Firm* — Brian B. Shaw, Esq.; Thomas B. Ryan, Patent Agent; Harter Secrest & Emery LLP

(57) ABSTRACT

A device for picking up, transporting and sorting electronic components in particular integrated circuits includes at least one loading device, one transport device, and one unloading device. The transport device has at least one transport wheel which is rotatable around a rotation axis and which has a peripheral face. The transport device also has at least one pick-up module which is arranged at the peripheral face and is suitable for accommodating components. In addition, the transport device is provided with a pressure source which is connected to the pick-up module. The pick-up module has at least one pick-up space for one individual component which extends along the peripheral face and can be moved between an initial position and an end position. The pressure source enables a prescribed pressure to be exerted at the pick-up space by means of which the component can be retained at the pick-up space or can be ejected from the pick-up space.

41 Claims, 10 Drawing Sheets

(56) References Cited

U.S. PATENT DOCUMENTS

Figure 1:
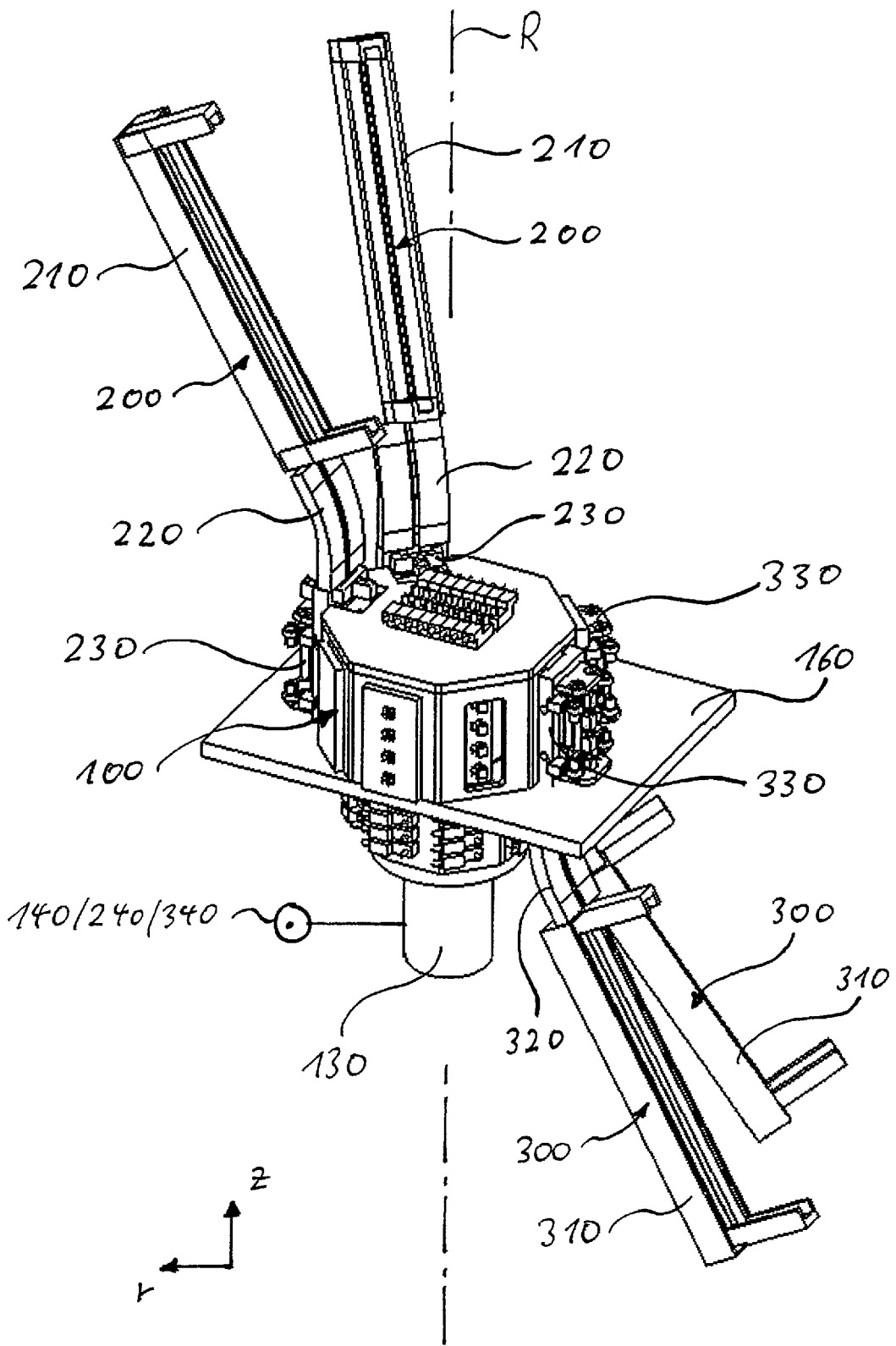

| | | | |
|---|---|---|---|
| 6,088,911 A * | 7/2000 | Isogai et al. | 29/740 |
| 6,098,785 A * | 8/2000 | Van Maanen | 198/459.8 |
| 6,311,824 B1 * | 11/2001 | Van Pul | 198/377.08 |
| 6,325,201 B1 * | 12/2001 | Bailey et al. | 198/471.1 |
| 6,374,996 B1 * | 4/2002 | Hsieh | 198/750.12 |
| 6,672,446 B2 * | 1/2004 | Boldrini et al. | 198/471.1 |
| 6,942,086 B2 * | 9/2005 | Bridges et al. | 198/377.08 |
| 6,967,475 B2 | 11/2005 | Tsui et al. | |
| 7,131,524 B2 * | 11/2006 | Wohltmann | 198/471.1 |
| 7,144,009 B2 * | 12/2006 | Kim | 271/276 |
| 7,156,219 B2 * | 1/2007 | Voigtmann et al. | 198/377.04 |
| 7,234,585 B2 * | 6/2007 | Draghetti et al. | 198/471.1 |
| 7,540,369 B2 * | 6/2009 | Momich | 198/418 |
| 7,650,984 B2 * | 1/2010 | Giuliani et al. | 198/471.1 |

FOREIGN PATENT DOCUMENTS

| | | |
|---|---|---|
| DE | 10061565 | 6/2002 |
| EP | 0269889 | 6/1988 |
| WO | 03/096158 | 11/2003 |

* cited by examiner

TRANSPORT ASSEMBLY

CROSS-REFERENCE TO RELATED APPLICATIONS

This application claims priority under 35 U.S.C. §119(b) to German Patent Application No. 10 2007 001 722.9-33, filed in the German Patent and Trademark Office on Jan. 11, 2007, the entire disclosure of which is incorporated by reference.

STATEMENT REGARDING FEDERALLY SPONSORED RESEARCH OR DEVELOPMENT

Not applicable.

REFERENCE TO A "SEQUENCE LISTING"

Not applicable.

BACKGROUND OF THE INVENTION

1. Field of the Invention

The invention relates to a transport device for electronic components, in particular integrated circuits, a loading device to supply electronic components to the transport device and an unloading device for removing the electronic components from the transport device. The invention also relates to a device for picking up, transporting and sorting electronic components comprising a loading device, a transport device and an unloading device.

2. Description of Related Art

Electronic components such as integrated circuits (IC) for example, are subject to quality tests which, since such components are mass produced, are performed to a large extent fully automatically. Accordingly, devices are known in the prior art which serve to pick up components to be tested, then to separate them into individual items and to transport them to one or more test stations by means of transport devices. The known devices also serve to transfer the components to be tested to a contacting installation which enables the components to be contacted to the test stations and tested, and subsequent to the test, to sort them and to introduce them into a magazine. A device of this kind is described, for example in DE 38 12 202 A1.

With a view to achieving a high throughput rate, there are devices designed as what are known as 'turret handlers'. A device of this kind is disclosed in EP 0 269 889 A1. This device has, downstream of a separate loading device, a transport wheel which has peripherally attached receiving cages for electronic components. The transport wheel is operated intermittently so that the electronic components in the receiving cages can pass consecutively through a loading station, a test station and an unloading station. In the test station the receiving cage is pushed radially outwards to bring the terminal contacts of the electronic component into contact with a test adapter. The receiving cage is provided with a reverse-locking element on a see-saw catch pivotally mounted on a joint. The end of the catch further away from the reverse-locking element is acted on by a pressure spring which causes the reverse-locking element to protrude into a receiving channel and in this way to prevent the component located in the channel from falling out.

SUMMARY OF THE INVENTION

The object of the invention is to create a compactly designed device with which electronic components can be handled reliably and at a high throughput rate.

The transport device according to the invention is based on the knowledge that a pick up space must be so arranged that this space extends essentially along the peripheral face of the transport wheel. Unlike transport devices known hitherto, in which the pick-up space extends along the end face of the transport wheel, the arrangement of the pick-up space according to the invention offers the advantage that the entire peripheral face can be used to receive components. On the one hand, the peripheral face available, being much larger than the face of the end section, provides for a larger number of pick-up modules and accordingly a larger number of pick-up spaces. On the other hand, the arrangement of the pick-up space(s) along the peripheral face offers good accessibility which ensures simple connection of devices cooperating with the transport device such as, for example, a loading device, an unloading device or a test station.

Furthermore, the transport device according to the invention makes use of the knowledge that the pick-up module is to be configured such that the pick-up space can be moved between an initial position and an end position. In the end position of the pick-up space, the pick-up module can pick up a component or can supply it, for example, to an adapter for a test station or to a unloading device. In the initial position of the pick-up space, by contrast, the component collected by the pick-up module is moved by the transport wheel to transport it from, for example, a supply device to the adapter of the test station. The transport device is thus characterized by the combination of the rotational movement of the transport wheel and the preferably linear or, for example radial, movement of the pick-up space(s) between the initial position and the end position.

The pick-up module according to the invention is linked to a pressure source to enable a prescribed pressure to be exerted on the pick-up space of the pick-up module. The pressure employed here is a pressure lower than the ambient pressure, i.e. partial vacuum, or a pressure higher than the ambient pressure, i.e. high pressure. If the partial vacuum at the pick-up space is sufficiently strong, the component will be retained at the pick-up space by the suction generated by the partial vacuum. By contrast, the component will be ejected if the partial vacuum at the pick-up space is too weak, is the ambient pressure or a higher-than-ambient pressure. Control of the pressure by means of a control installation makes it possible to retain the components in the pick-up module during the transport achieved by rotation of the transport wheel and, when the foreseen station is reached, for example, a test station, to transfer them to the testing device located at that test station. Unlike the prior art disclosed in EP 0 269 889 A1, the transport device according to the invention does not require any mechanisms, and thus parts which are prone to wear, in order to retain and transport the components. The retention and transfer of component parts is achieved by pneumatic means and, accordingly, in addition to wear-free design, the components can be transported reliably and with high throughput rates.

In a preferred embodiment of the transport device according to the invention the pick-up space extends essentially parallel to a level in the area of the pick-up module tangential to the peripheral face. In this case the normal lines of the level in which the pick-up space extends run in a radial direction. Accordingly, the components can be fed to or taken from the pick-up space in a radial direction.

In a further preferred embodiment the transport device according to the invention is provided with a motor by which the transport wheel can be driven. It is expedient for this motor to be an electric motor, for example a servo motor, which enables the transport wheel to be operated intermittently.

It is preferable for the rotation axis to extend essentially in a vertical direction. This enables the transport wheel to be arranged in a lying position which is advantageous above all when the components can be fed to the transport wheel by means of the loading device according to the invention and making use of gravitational force. With a view to the modular construction of the transport device according to the invention, a number of transport wheels can be arranged vertically above one another. The number of transport wheels depends on the application in question and is related in particular to the required throughput of components.

Preferably the pick-up module has at least one control plunger which is movable in a radial direction between the initial position and the end position. For practical purposes the control plunger has one free end which forms the pick-up space. In the initial position of the control plunger the component is held in the receiving space. The control plunger is moved into the end position when the component is to be taken up by a loading device, for example, or to be transferred to an unloading device. To ensure a simple and exact movement of the control plunger between the initial position and the end position, the control plunger is preferably moved from the initial position to the end position against the effect of a returning force. As a result of the returning force, expediently generated by a spring element, the control plunger is automatically restored to the initial position once the power driving the control plunger into the end position is removed. For practical purposes the control plunger is connected to a dog which is guided in a rail to ensure precise movement of the control plunger. This rail preferably has an end buffer for the dog so that the initial position and/or the end position in the radial direction are exactly defined.

To generate a prescribed pressure at the pick-up space, it is advantageous for the control plunger to have an air connection. In this context it has proved expedient for the control plunger to be provided with a hollow chamber which is connected via the air connection to the pressure source and which emerges at the pick-up space.

In a preferred embodiment the transport device according to the invention has a control installation for the pick-up module which is arranged inside the transport wheel. The control installation advantageously comprises a mounting arranged concentrically with the transport wheel that has at least one actuator. The actuator is preferably operated electrically or pneumatically and serves to move the control plunger between the initial position and the end position. For this purpose the actuator is preferably fitted with a ram which impinges on the control plunger in the radial direction.

To ensure a high throughput of components, the pick-up module is preferably provided with a multitude of pick-up spaces arranged either adjacent to and/or above and below one another. Expediently the control installation has at least the number of actuators as there are pick-up spaces on the pick-up module so that the pick-up spaces can be controlled individually. However, depending on the application, it is possible to assign a group of pick-up spaces to one common actuator.

It is preferable for the transport wheel to have a polygonal peripheral face which is sub-divided into a multitude of attachment faces. On the attachment faces, which extend on one level orthogonal to the radial direction, there expediently are a number of pick-up modules. The pick-up modules are preferably arranged at a regular distance from each other, for example, at every other attachment face. Depending on the application it is possible to attach several pick-up modules at one common attachment face.

The loading device according to the invention is characterized by a transfer module by means of which the components are transferred to the transport device's pick-up module. To achieve this the transfer module has a transfer space for a single component which lies opposite the pick-up space of the pick-up module when the transport wheel is in a prescribed position, in other words, when the pick-up module concerned reaches the position of the, as a rule, stationary loading device. The transfer module holds the component ready for transfer to the pick-up module when the transfer space and the pick-up space are positioned opposite each other.

In a preferred embodiment of the loading device according to the invention, the transfer module has a guide channel for the components which has a sliding surface. It is practical for the guide channel to extend in a vertical direction so that the components can be conveyed to the pick-up space(s) by making use of gravitational force. It is advantageous when the guide channel has two guides bordering the sliding surface. It is preferable for the guides to be movable, at least in the area of the transfer space between an initial position and an end position. The guides which are expediently movable in a way similar to a pair of pincers enable the components, in the initial position, to slide exactly into the transfer space(s) and, in the slightly more open end position vis-à-vis the initial position, ensure an easy transfer of the component to the transport device's pick-up module.

In a further preferred embodiment the loading device has a pressure source which is connected to the transfer module. This pressure source enables a prescribed pressure to be generated at the transfer space to retain or to eject the component at the transfer space. The retention and the transfer of the component by the transfer module, accordingly, is performed pneumatically in the same way as in the transport device's pick-up module and thus facilitates, with a wear-free design, a high throughput of components as they are fed to the transport device.

It is preferable for the sliding surface in the area of the transfer space to be provided with an aperture which is connected to the pressure source. Through the control of the pressure source by means of a control installation, it is possible to govern the pressure at the aperture and thus at the transfer space so that the components are retained or ejected.

It is of further advantage for the guide channel in the area of the transfer space to be provided with a catch which can be moved in a direction essentially orthogonal to the sliding surface between a flow position and a blocked position. Such a catch is useful above all when the guide channel extends in a vertical direction so that the components moving downwards can be stopped at the transfer space by the catch in the blocked position. In this context it has proved advantageous for the catch, when going from the flow position to the blocked position to be working against the effect of a returning force so that the catch automatically returns to the flow position when the force moving the catch into the blocked position is no longer applied. It is expedient for the returning force to be provided by a spring element.

In a preferred embodiment the loading device according to the invention has a control installation which is provided with at least one actuator. The actuator, driven preferably either pneumatically or electrically, serves to move the catch and/or the movable guides of the guide channel between the flow position and the blocked position and the initial position and the end position respectively. For this purpose, it is advantageous for the actuator to be provided with a ram impinging on the catch or to be connected with a lever which impinges on the movable guides. The lever enables a linear movement of the actuator to be converted into a pincer-type movement of the guides.

To ensure a high throughput rate of components, the transfer module preferably has a multitude of transfer spaces arranged adjacent to and/or above and below one another. In such a case, it is expedient for the control installation to be provided with at least the same number of actuators as the number of transfer spaces so that the transfer spaces can be controlled individually. In an analogous way to the control installation of the transport device, it is possible for a group of transfer spaces to be assigned to one actuator.

In order to make the components available individually at the transfer space, it is advantageous for the transfer module to have a separating installation. The separating installation can be configured for example as disclosed in DE 198 27 458 C2 or DE 100 61 565 C2. What is more, the separating installation can be formed of two pneumatically operated catches known as a "stopper" and a "holder" which single out the components that are lined up and fed to the transfer module.

Above all, when the components are advanced within the loading device using gravitational force, it has proved advantageous to connect the loading rail and the transfer module by a transition rail which preferably is curved in a convex manner. The convex curvature of the transition rail enables the guide channel of the transfer module to be oriented vertically and the loading rail to be oriented in a direction at an angle to the vertical. The unloading device according to the invention is also characterized by a transfer module which is constructed in principle in the same manner as the transfer module of the loading device. The unloading device's transfer module thus has a transfer space for one individual component which lies opposite the pick-up space of the pick-up module when the transport wheel is located in a prescribed position.

Preferably, the unloading device is provided with a transition rail which connects the discharge rail and the transfer module. The unloading device's transition rail, in contrast to the loading device's transition rail, is expediently curved in a concave manner so that the components can be guided from the transfer module to the discharge rail using the force of gravity.

The device for picking up, transporting, and sorting of electronic components according to the invention has at least one loading device, at least one transport device and at least one unloading device. The device for picking up, transporting and sorting of electronic components thus benefits from the advantages of the loading device, transport device and unloading device according to the invention. Furthermore, the device according to the invention is characterized by a modular construction thanks to which the number of loading devices, transport devices and unloading devices can be varied depending of the specific application.

Preferably the device according to the invention comprises at least one test device by means of which the components can be tested. In a further preferred embodiment the device according to the invention has a fastening plate on which the transport device is rotatably mounted. In this context it has also proved advantageous to secure the loading device and/or the unloading device to this fastening plate.

BRIEF DESCRIPTION OF THE SEVERAL VIEWS OF THE DRAWING(S)

Figure 2:
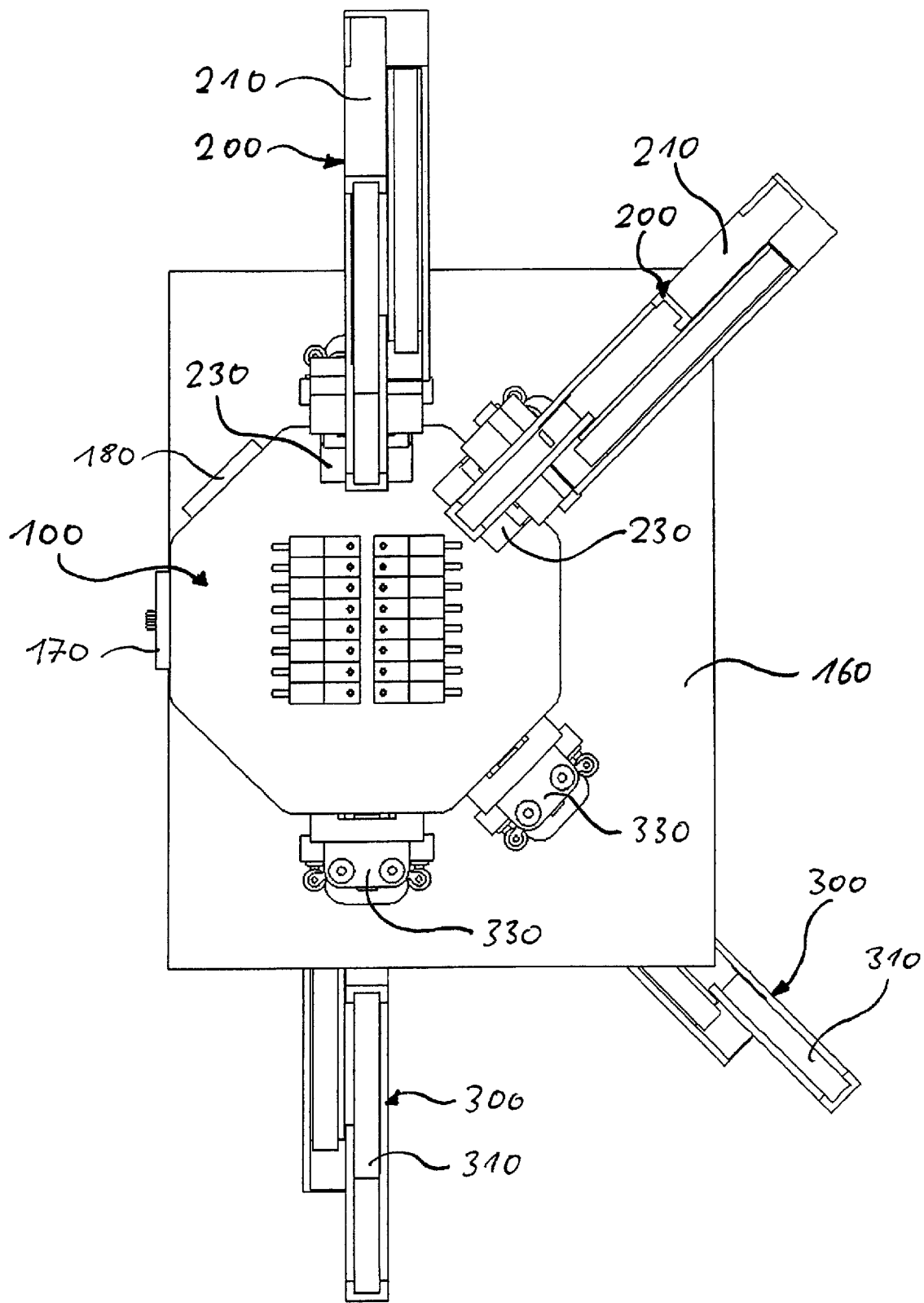
Figure 3:
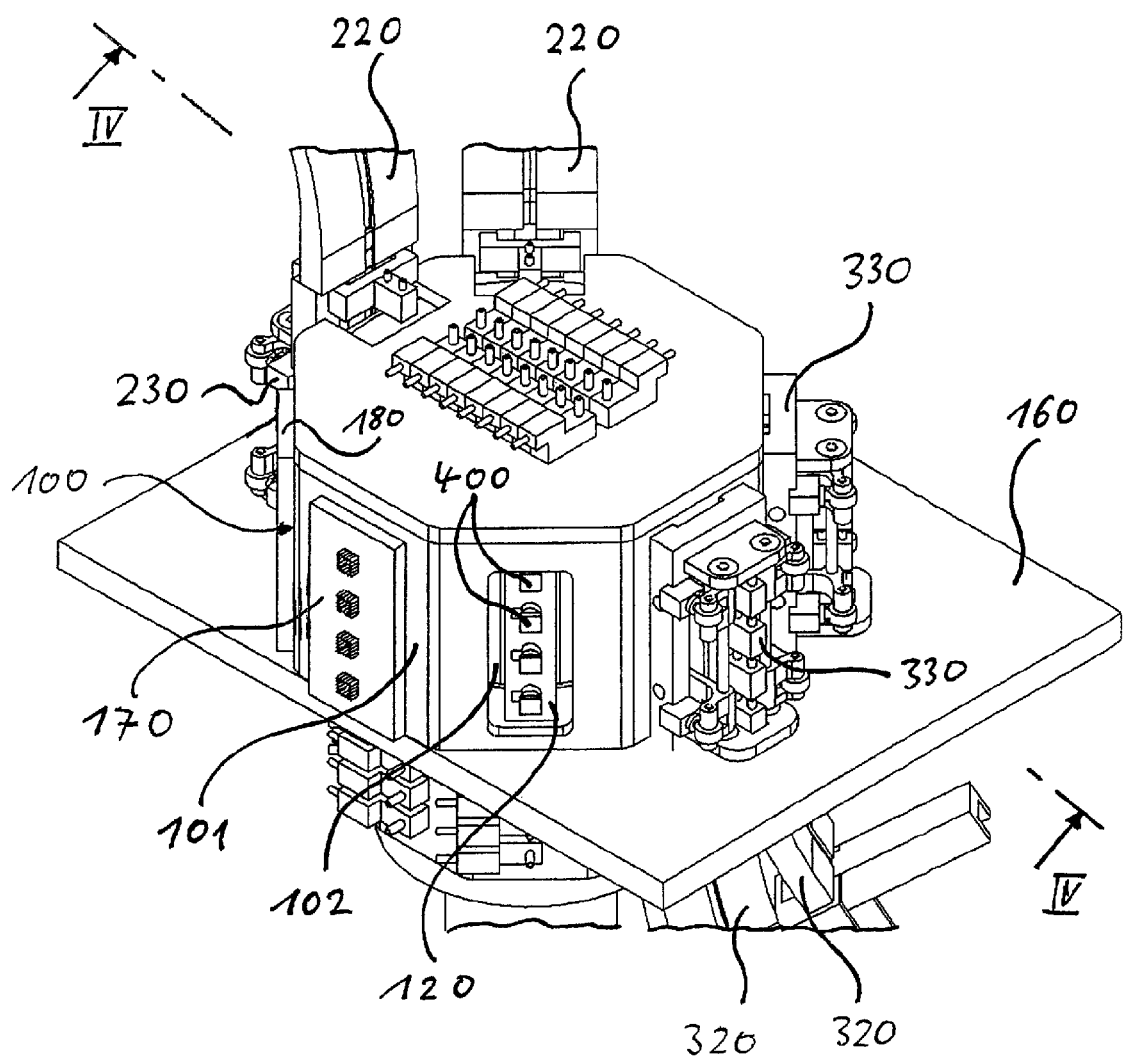
Figure 4:
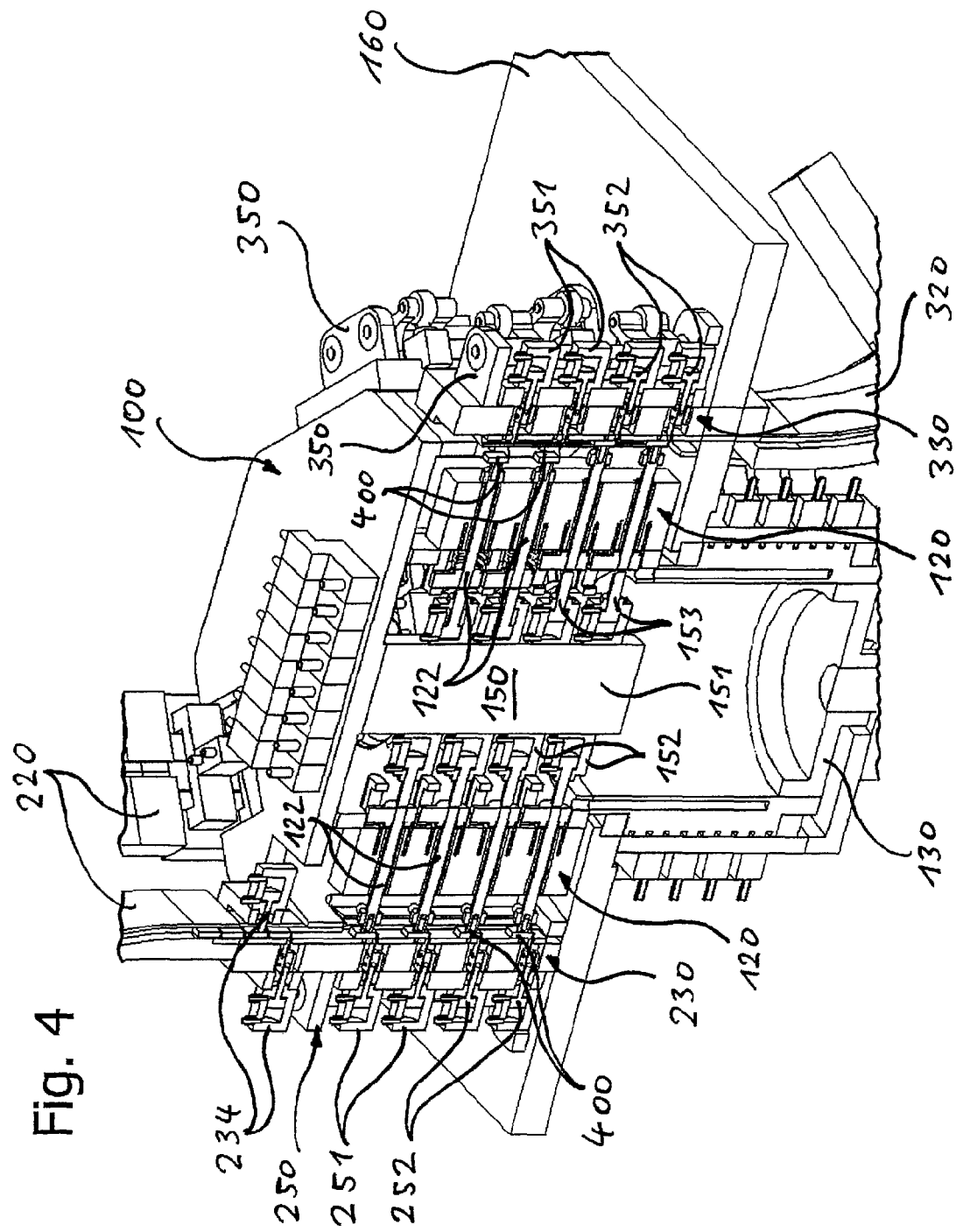
Figure 5:
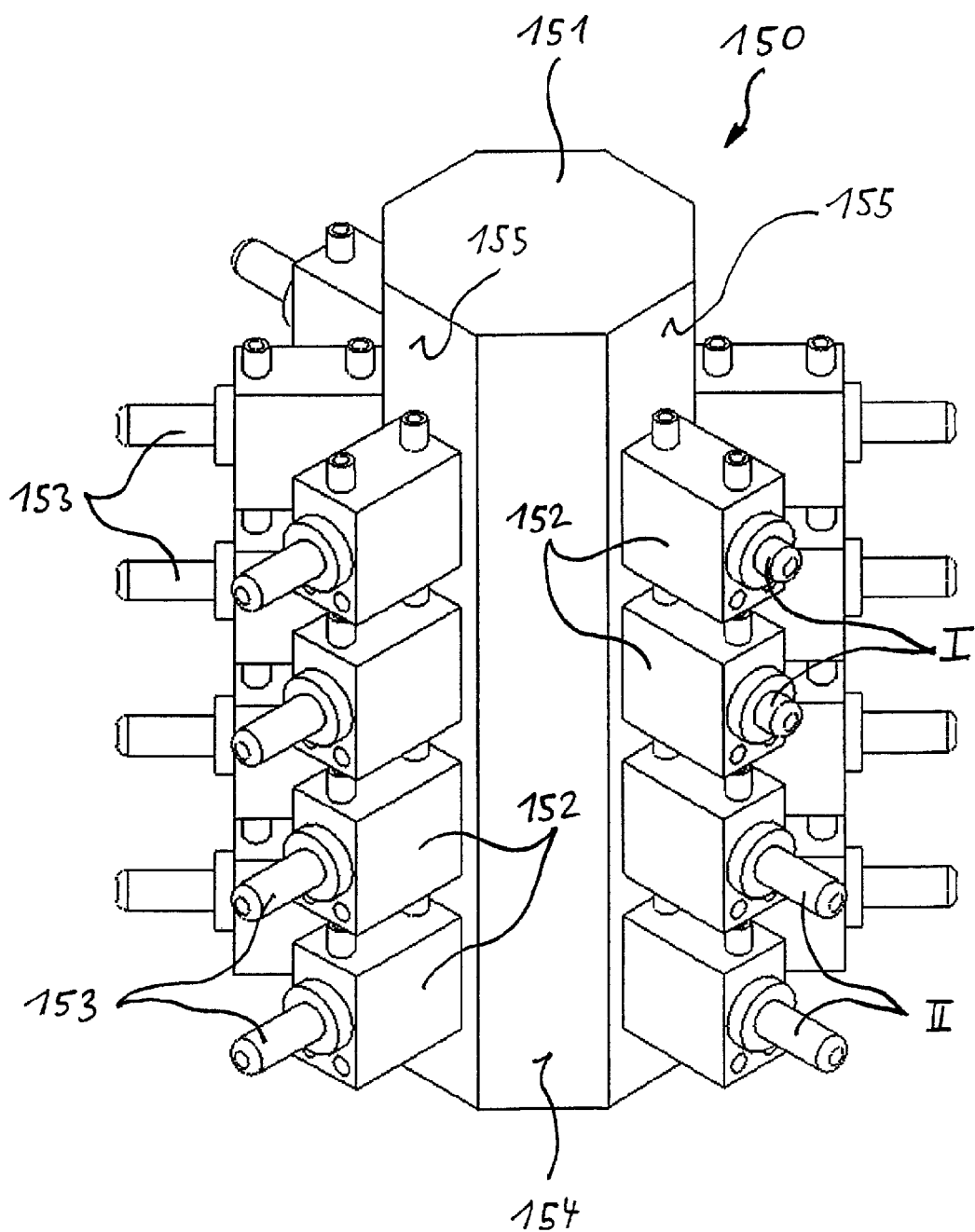
Figure 6:
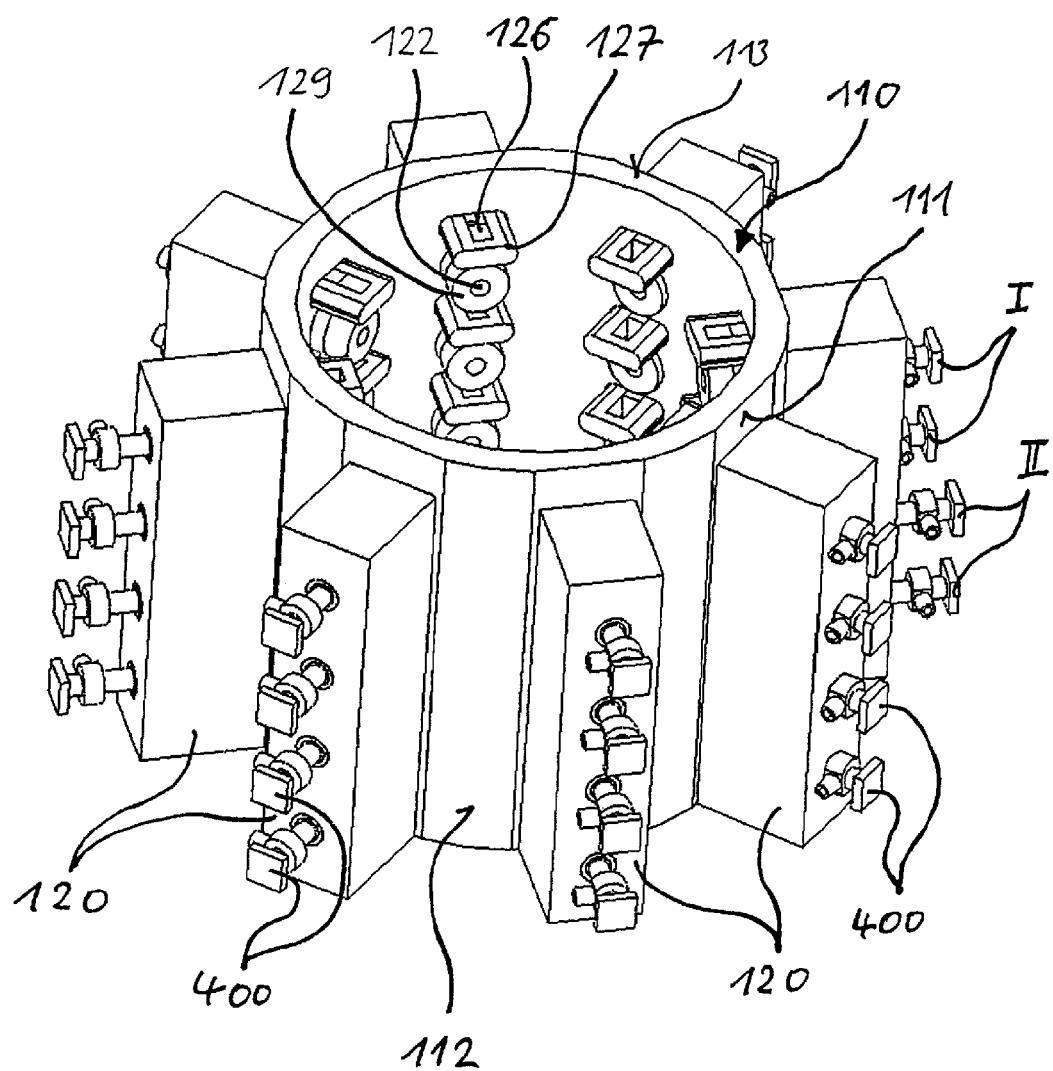
Figure 7:
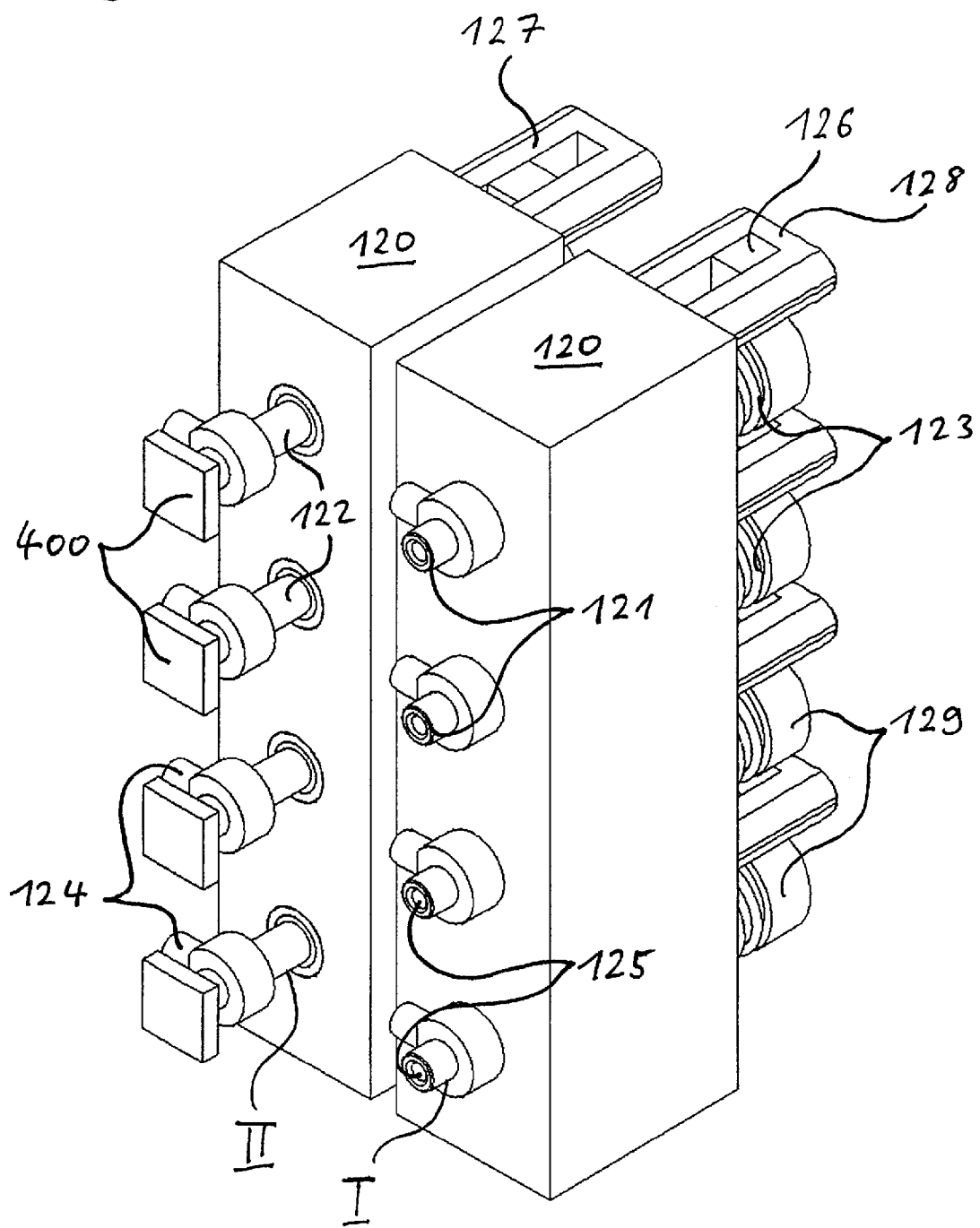
Figure 8:
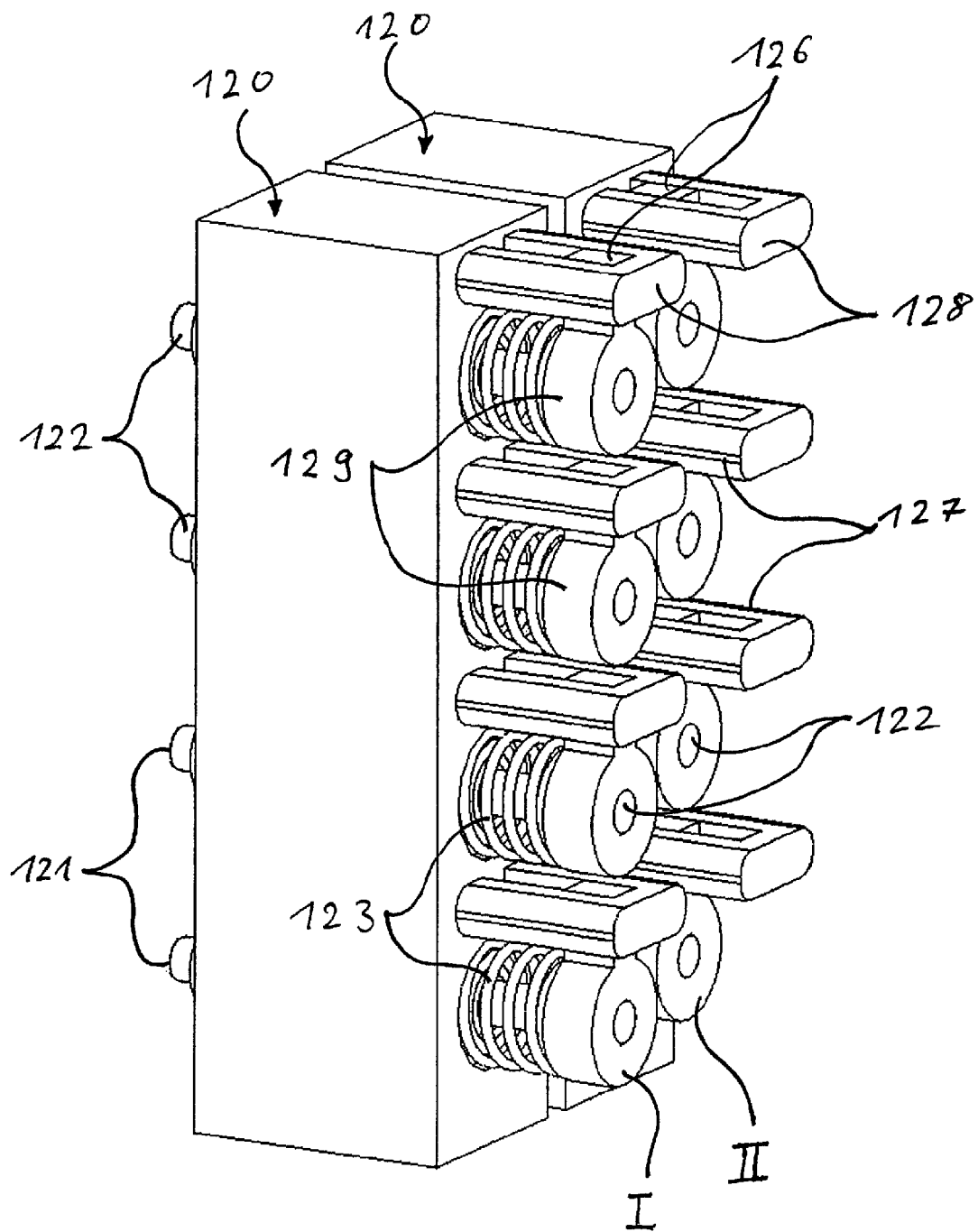
Figure 9:
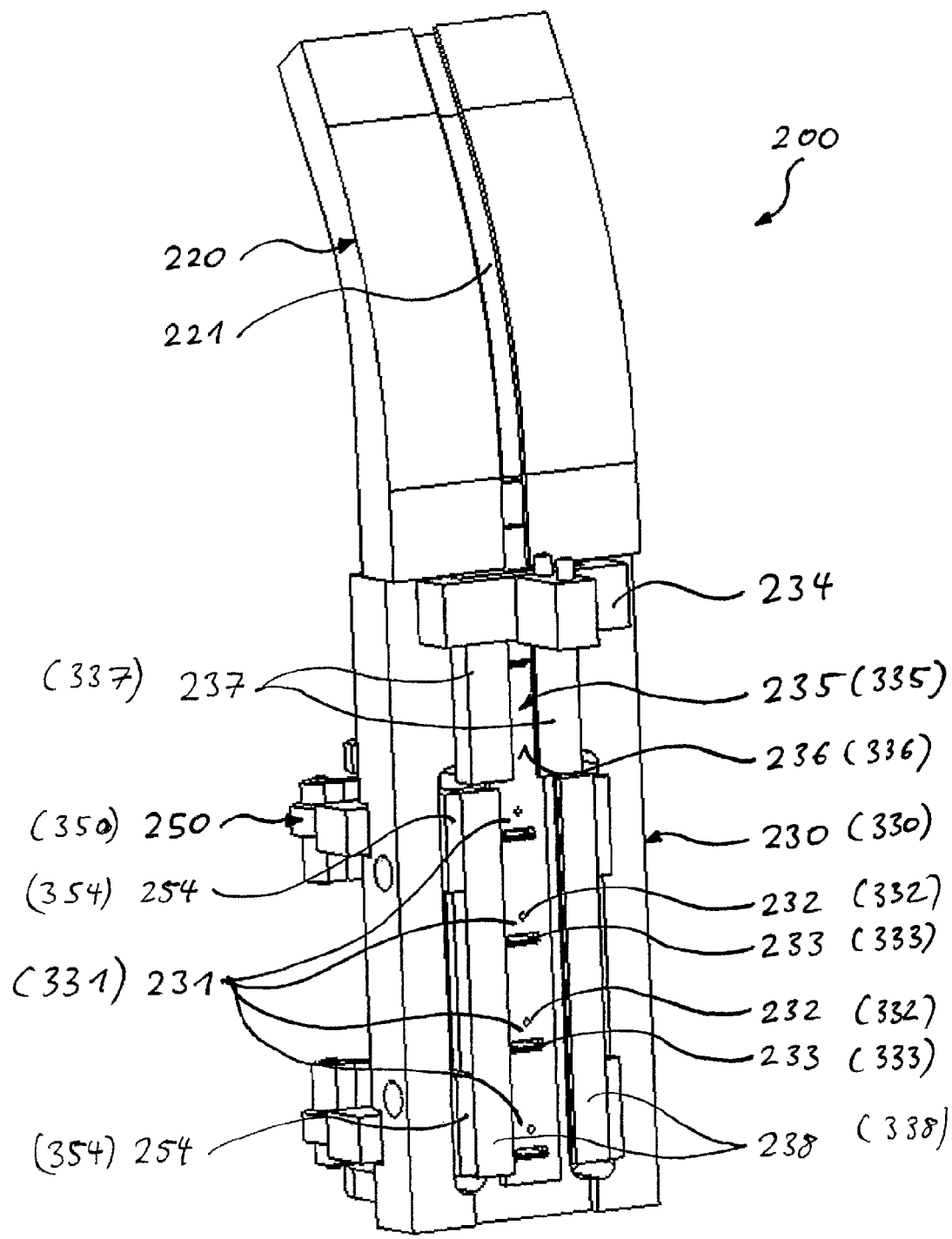
Figure 10:
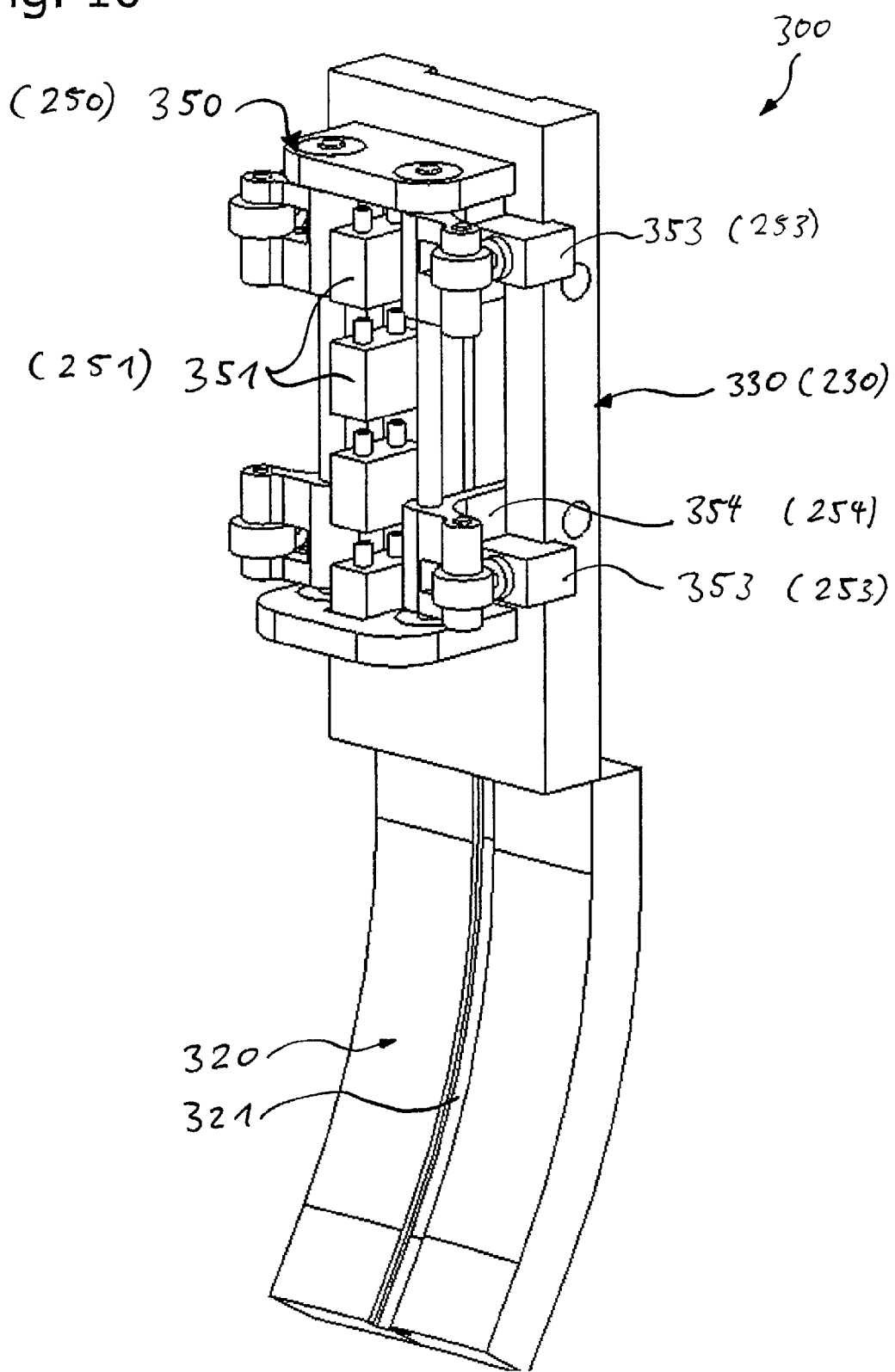

Details and further advantages of the invention will become clear from the following description of an example of a preferred embodiment. The figures, which give merely a schematic representation of an example of an embodiment, show:

FIG. 1 a perspective view of a device for picking up, transporting and sorting electronic components which consists of a loading device, a transport device and an unloading device;

FIG. 2 a view from above of the device according to FIG. 1;

FIG. 3 a perspective view as in FIG. 1, but an enlarged perspective view of the device according to the invention;

FIG. 4 a longitudinal cross-section along the line IV-IV in FIG. 3;

FIG. 5 a perspective view of a control installation for the transport device;

FIG. 6 a perspective view of a transport wheel of the transport device on the peripheral face on which a number of pick-up modules are arranged;

FIG. 7 a perspective view of two pick-up modules showing the front side of the modules;

FIG. 8 a perspective view of the pick-up modules showing the rear side of the modules;

FIG. 9 a perspective view of the loading device according to the invention showing a convex transition rail and transfer module, and FIG. 10 a perspective view of the unloading device according to the invention showing a transfer module and a concave transition rail.

DETAILED DESCRIPTION OF THE INVENTION

The device displayed in FIG. 1 for picking up, transporting and sorting electronic components 400 consists of a transport device 100, two loading devices 200 and two unloading devices 300. The loading devices 200 and the unloading devices 300 are stationary and attached to a fastening plate 160. By contrast, the transport device 100 is rotatably mounted on the fastening plate 160.

As can be seen in particular in FIGS. 2 to 4, the transport device 100 has a housing 101 which is provided with apertures 102 at prescribed locations and in which a transport wheel 110 is arranged. The transport wheel 110 is driven by means of an electric motor 130 in a counter-clockwise direction around a rotation axis R which extends in a vertical direction z and it has a polygonal peripheral face 111 which is sub-divided into a number of attachment faces 112 as well as having an end face 113. As can be seen in FIG. 6 in particular, when looking at the periphery, every second attachment face 112 has a pick-up module 120 attached to it which is connected to a pressure source 140.

Each of the pick-up modules 120 has four control plungers 122 arranged one above the other in a vertical direction z which can be moved in a radial direction r that is orthogonal to the vertical direction z between an initial position I and an end position II; this is shown most clearly in FIGS. 7 and 8. The control plungers 122 each have an open end which forms the pick-up space 121 for one individual component 400. The end of the control plunger 122 away from the open end is acted on by a spring element 123. The spring element 123 generates a returning force against the effect of which the control plunger 122 is moved from the initial position I to the end position II. In this way the spring element 123 ensures that the control plunger 122 always returns automatically to its initial position I when the force which moves the control plunger 122 into the end position II is removed. The spring element 123 is tensioned between a housing of the pick-up module 120 which guides the control plunger 122 and an attachment 129 which is connected to the control plunger 122. The attachment 129 is provided with a dog 126 which is moved in a radial direction r within a guide 127 fixed to the housing of the pick-up module 120. The guide 127 forms an end stop 128 for the dog 126 in the initial position I. An end stop for the dog 126 in the end position II is formed by the housing of the pick-up module 120.

As can be seen in particular in FIG. 7 the control plunger 122 is provided with an air connection 124 which is coupled to a pressure source 140 by pipes that are not shown. The air connection 124 is linked to a hollow chamber 125 in the control plunger 122 which emerges into the pick-up space 121 so that a prescribed pressure can be generated by the pressure source 140 and exerted at the pick-up space 121 by means of which a component 400 can be retained or ejected.

In the inside of the transport wheel 110 there is a control installation 150 for the pick-up module 120, as can be seen clearly in FIG. 4. FIG. 5 shows that the control installation 150 has an attachment 151 arranged concentrically to the transport wheel 110 with a polygonal peripheral face 154. On this peripheral face 154 subdivided into a number of attachment faces 155 there are a number of electrically or pneumatically operated actuators, to this extent analogous to the peripheral face 111 of the transport wheel 110. The number of actuators 152 per attachment face 155 corresponds to the number of pick-up spaces 121 of one individual pick-up module 120. The number of actuators 152 per attachment face 155 corresponds to the number of pick-up spaces 121 of one individual pick-up module 120. In the case illustrated provision is made for four actuators 152 per attachment face 155, whereby the actuators 152 are arranged one above/below the other in a vertical direction z to correspond to the control plunger 122. In correspondence to the number and arrangement of the pick-up modules 120 on the transport wheel 110, considered in terms of the periphery, there is a group of four actuators 152 arranged at every second attachment face 155. In this way, it is ensured that in every position of the transport wheel 110 the control plunger 122 can be controlled individually by the actuators 152. For this purpose the actuators 152 are each provided with a ram 153 which impinges on the end of the control plunger 122 away from the pick-up space 121 and in such a way that the control plunger 122 can be moved by the ram 153 in the opposing direction to the force of the spring element 123 from the initial position I to the end position II.

As is shown particularly in FIGS. 1 and 9, the loading device 200 has a loading rail 210 extending at an angle to the vertical direction z, a convex transition rail 220 and a transfer module 230. The loading rail 210 is suitable for accommodating a number of components 400. The transition rail 220 which connects the loading rail 210 and the transfer module 230 with each other is provided with a guide channel 221 which leads into a guide channel 235 of the transfer module 230 that extends essentially in a vertical direction z. The guide channel 221 serves to convey the components 400 using gravitational force from the supply rail 210 into the guide channel 235.

The guide channel 235 is provided with a sliding surface 236 which is bordered by two guides 237, 238. In the upper area of the guide channel 235 facing the transition rail 220 the guides 237 are configured in a fixed position. In this area there is a separating installation 234 which is formed of a stopper and a holder. The stopper and the holder are, for example, electrically or pneumatically operated catches which stop and hold the components 400 to ensure that they travel through the guide channel 221 individually one after the other. In the lower area of the guide channel 235 adjacent to this upper area, the guides 238 are configured in a movable way and in such a way that from the initial position, in which the guides 238 have essentially the same distance between each other as the fixed guides 237, they can be moved to an end position in which the guides 238 have a greater distance between them than the guides 237.

In the area of the movable guides 238 the transition module 230 has a number of transfer spaces 231 each for a single component 400. The number and the arrangement of the transfer spaces 231 corresponds to the number and arrangement of the pick-up spaces 121 of a pick-up module 120. In this way it is possible in a specific position of the transport wheel 110 when a pick-up module 120 and a transfer module 230 are located opposite each other for the components 400 to be able to be transferred from the transfer space 231 to the pick-up space 121.

The guide channel 235, in the area of any one of the transfer spaces 231, is provided with a catch 233 which can be moved in a direction essentially orthogonal to the sliding surface 236 between a flow position and a blocked position. It is practical for the movement of the catch 233 from the flow position into the blocked position to be against the force generated by a spring element, not shown in the figure, so that the catch 233 returns to the flow position when the force driving the catch 233 into the blocked position is removed. Furthermore, in the area of a transfer space 231 the sliding surface 236 is provided with an aperture 232 which is connected to a pressure source 240. The pressure source 240 makes it possible to exert a prescribed pressure at the transfer space 231 to retain the component 400 at the transfer space 231 or to eject the component 400 from the space in the case of a transfer to a pick-up module 120.

The loading device 200 also has a control installation 250 which serves to control the catches 233 and the movable guides 238. For this purpose, the control installation 250 is provided with a number of, for example, electrically or pneumatically operated actuators 251, 253. In order to move the catches 233 between the flow position and the blocked position, the actuators 251 are each provided with a ram 252 which impinges on one catch 233. The actuators 253 which control the movable guides 238 are each connected to a lever 254 which impinges on the guide 238 and converts the linear movement of the actuator 253 into a pincer movement of the guides 238 achieved between their initial position and their end position. The number and the arrangement of the actuators 253 corresponds to the number and the arrangement of the transfer spaces 231. The guides 238 are each moved by two actuators 253.

As is shown in particular in FIGS. 1 and 10, the unloading device 300 has a discharge rail 310 extending at an angle to the vertical direction z, a concave curved transition rail 320 and a transfer module 330. The transition rail 320 connects the discharge rail 310 and the transfer module 330 with each other and is provided with a guide channel 321 through which the components 400 are conveyed using gravitational force from the transfer module 330 into the discharge rail 310.

The transfer module 330 corresponds in essence to the transfer module 230 of the transport device 200. Accordingly, the transfer module 330 has four transfer spaces 331 arranged above/below each other which, in a specific position of the transport wheel 120, directly face the pick-up spaces 121 of a pick-up module 120. Furthermore, the transfer module 330 has a guide channel 335 which is provided with a sliding surface 336 bordered by two movable guides 338. With a view to the modular configuration of the transfer module 330, the guide channel 335 can also have two fixed guides 337 in the area of transition to the transition rail 320. Since it is not necessary for the unloading of the components 400 to separate them, in contrast to the transfer module 230, neither a separating installation nor fixed guides 337 are absolutely necessary here. Like the configuration of the transfer module 230, the transfer module 330 has an aperture 332 in the area of each transfer space 331 which is connected to a pressure source 340 and a catch 333 which can be moved between a flow position and a blocked position. The catches 333 and the movable guides 338 are controlled by a control installation 350 which is constructed essentially in an analogous way to the control installation 250 for the loading device 200. Accordingly, the control installation 350 has a number of actuators 351 each with one ram 352 to move the catches 333 between the flow position and the blocked position. In addition, the control installation 350 has actuators 353, which are linked to a lever 354, that impinge on the movable guide 338 in order to move the guide between the initial position and the end position.

As can be clearly seen in FIGS. 2 and 3, an adapter 170 can be located in the area of the apertures 102 which serves to connect the components 400 to a test station. It is also possible to locate an installation 180 in the area of the apertures 102 which serves to position the components 400 exactly before they are transported to the adapters 170. And it is possible to leave the apertures 102 open to enable visual inspection of the components 400.

The device for picking up, transporting and sorting of electronic components 400 described above is characterized by its modular design. This is attributable above all to the fact that the number and configuration of the transport devices 100, the loading devices 200 and the unloading devices 300 can be adapted to the application in question with comparatively little trouble. In particular, the number of pick-up modules 120 and pick-up spaces 121, as well as transfer modules 230, 330 and transfer spaces 231, 331 can easily be varied in order to obtain the desired throughput of components 400. Above all, the arrangement of the pick-up spaces 121 along the peripheral face 111 is here the major contributing factor. The configuration of these spaces can also ensure good accessibility which makes it possible to arrange around the transport device 100 a number of different stations which the components 400 would normally pass through before reaching the loading device 200 and the unloading device 300 in particular the installation 180 for aligning the components 400, the adapter 170 or the inspection station formed by leaving the apertures 102 open. Moreover, the combination of the rotational movement of the transport wheel 110 and the radial movement of the pick-up spaces 121 ensures rapid transport of the components 400. Finally, but not least, the pneumatic retention and release of the components 400 between the transfer modules 230, 330 and the pick-up modules 120 further contributes to reliable and rapid handling of the components 400.

The invention claimed is:

1. A transport device for electronic components, comprising:
    at least one transport wheel movable around a rotation axis and comprising a peripheral face;
    a plurality of pick-up modules arranged on the peripheral face and located at different positions along the rotation axis, each pick-up module suitable for accommodating at least one electronic component;
    a pressure source connected to each pick-up module,
    whereby each pick-up module is provided with at least one pick-up space for the at least one electronic component which extends along the peripheral face and is movable by an actuator between an initial position an end position, radially spaced from the initial position, relative to the rotation axis;
    each pick-up module being provided with at least one control plunger which can move in a radial direction between an initial position and an end position, whereby the control plunger comprises an open end that forms the pick-up space; and
    the control plunger being provided with a hollow chamber which is connected to the pressure source and which emerges at the pick-up space,
    whereby a prescribed pressure can be generated at the pick-up space by the pressure source by means of which the at least one electronic component can be retained at the pick-up space or can be ejected from the pick-up space.

2. The transport device of claim 1 wherein the pick-up space extends essentially parallel to a level tangential to the peripheral face in the area of the pick-up module.

3. The transport device of claim 1 further comprising a motor by which the transport wheel can be intermittently driven.

4. The transport device of claim 1 wherein the rotation axis extends in an essentially vertical direction.

5. The transport device of claim 4 further comprising second and third transport wheels arranged one above the other in a vertical direction.

6. The transport device of claim 1 wherein the control plunger is movable against the effect of a returning force generated by a spring element from the initial position into the end position.

7. The transport device of claim 1 wherein the control plunger is connected to a dog which is guided in a guide whereby the guide forms an end stop for the dog.

8. The transport device of claim 1 wherein the control plunger is provided with an air connection.

9. The transport device of claim 1 further comprising a control installation for the pick-up module arranged inside the transport wheel.

10. The transport device of claim 9 wherein the control installation is provided with a mounting arranged concentrically to the transport wheel on which at least one actuator is arranged whereby the actuator is operated electrically or pneumatically.

11. The transport device of claim 1 wherein the pick-up module has a number of pick-up spaces arranged adjacent to each other.

12. The transport device of claim 11 further comprising a control installation for the pick-up module arranged inside the transport wheel, wherein the control installation is provided with at least of as many actuators as pick-up spaces on the pick-up module.

13. The transport device of claim 1 wherein the transport wheel has a polygonal peripheral face which is sub-divided into a number of attachment faces.

14. The transport device of claim 13 wherein a number of pick-up modules are arranged on at least one attachment face whereby the number of pick-up modules are positioned at a regular distance from each other.

15. A transport assembly comprising:
    the transport device of claim 1; and
    a loading device cooperatively aligned with the at least one transport wheel, the loading device comprising:
        a loading rail sized to retain a number of electronic components, and a transfer module suitable for transferring the electronic components to the pick-up module of the transport device;

whereby the transfer module has at least one transfer space for an individual electronic component arranged in such a way that in a prescribed position of the transport wheel the pick-up space of the pick-up module is opposite the transfer space.

16. The transport device of claim 15 wherein the transfer module is provided with a guide channel for the electronic components which has a sliding surface.

17. The transport device of claim 16 wherein the guide channel is provided with two guides bordering the sliding surface whereby the guides at least in the area of the transfer space are configured to be movable between an initial position and an end position.

18. The transport device of claim 15 a second pressure source connected to the transfer module whereby a prescribed pressure can be exerted by the second pressure source at the transfer space by means of which the electronic component is retained at the transfer space or is ejected from the transfer space.

19. The transport device of claim 18 wherein the transfer module is provided with a guide channel for the electronic components which has a sliding surface and the sliding surface in the area of the transfer space is provided with an aperture that is connected to the second pressure source.

20. The transport device of claim 16 wherein the guide channel in the area of the transfer space is provided with a catch which can be moved in a direction essentially orthogonal to the sliding surface between a flow position and a blocked position.

21. A transport assembly comprising:
    a transport device for electronic components comprising:
        at least one transport wheel movable around a rotation axis and comprising a peripheral face;
        a plurality of pick-up modules arranged on the peripheral face and located at different positions along the rotation axis, each pick-up module suitable for accommodating at least one electronic component; and
        a pressure source connected to each pick-up module,
        whereby each pick-up module is provided with at least one pick-up space for the at least one electronic component which extends along the peripheral face and is movable by an actuator between an initial position an end position, radially spaced from the initial position, relative to the rotation axis, and
        whereby a prescribed pressure can be generated at the pick-up space by the pressure source by means of which the at least one electronic component can be retained at the pick-up space or can be ejected from the pick-up space;
    a loading device cooperatively aligned with the at least one transport wheel, the loading device comprising:
        a loading rail sized to retain a number of electronic components, and
        a transfer module suitable for transferring the electronic components to the pick-up module of the transport device,
        whereby the transfer module has at least one transfer space for an individual electronic component arranged in such a way that in a prescribed position of the transport wheel the pick-up space of the pick-up module is opposite the transfer space;
        the transfer module being provided with a guide channel for the electronic components which has a sliding surface; and
        the guide channel in the area of the transfer space being provided with a catch which can be moved in a direction essentially orthogonal to the sliding surface between a flow position and a blocked position,
        wherein the catch can be moved from the flow position to the blocked position against the effect of a returning force generated by a spring.

22. The transport device of claim 15 further comprising a control installation which is provided with at least one actuator whereby the actuator can be operated electrically or pneumatically.

23. A transport assembly comprising:
    a transport device for electronic components comprising:
        at least one transport wheel movable around a rotation axis and comprising a peripheral face;
        a plurality of pick-up modules arranged on the peripheral face and located at different positions along the rotation axis, each pick-up module suitable for accommodating at least one electronic component; and
        a pressure source connected to each pick-up module,
        whereby each pick-up module is provided with at least one pick-up space for the at least one electronic component which extends along the peripheral face and is movable by an actuator between an initial position an end position, radially spaced from the initial position, relative to the rotation axis, and
        whereby a prescribed pressure can be generated at the pick-up space by the pressure source by means of which the at least one electronic component can be retained at the pick-up space or can be ejected from the pick-up space;
    a loading device cooperatively aligned with the at least one transport wheel, the loading device comprising:
        a loading rail sized to retain a number of electronic components, and
        a transfer module suitable for transferring the electronic components to the pick-up module of the transport device,
        whereby the transfer module has at least one transfer space for an individual electronic component arranged in such a way that in a prescribed position of the transport wheel the pick-up space of the pick-up module is opposite the transfer space;
        the transfer module being provided with a guide channel for the electronic components which has a sliding surface; and
        the guide channel in the area of the transfer space being provided with a catch which can be moved in a direction essentially orthogonal to the sliding surface between a flow position and a blocked position,
        wherein the catch can be moved by the actuator between the flow position and the blocked position whereby the actuator is provided with a ram that impinges on the catch.

24. A transport assembly comprising:
    a transport device for electronic components comprising:
        at least one transport wheel movable around a rotation axis and comprising a peripheral face;
        a plurality of pick-up modules arranged on the peripheral face and located at different positions along the rotation axis, each pick-up module suitable for accommodating at least one electronic component; and a pressure source connected to each pick-up module, whereby each pick-up module is provided with at least one pick-up space for the at least one electronic component which extends along the peripheral face and is movable by an actuator between an initial position an end position, radially spaced from the initial position, relative to the rotation axis, and whereby a prescribed pressure can be generated at the pick-up space by the pressure source by means of which the at least one electronic component can be retained at the pick-up space or can be ejected from the pick-up space;

a loading device cooperatively aligned with the at least one transport wheel, the loading device comprising:

a loading rail sized to retain a number of electronic components, and a transfer module suitable for transferring the electronic components to the pick-up module of the transport device, whereby the transfer module has at least one transfer space for an individual electronic component arranged in such a way that in a prescribed position of the transport wheel the pick-up space of the pick-up module is opposite the transfer space;

the transfer module being provided with a guide channel for the electronic components which has a sliding surface; and the guide channel being provided with two guides bordering the sliding surface whereby the guides at least in the area of the transfer space are configured to be movable between an initial position and an end position, wherein the movable guides of the guide channel can be moved by the actuator between the initial position and the end position whereby the actuator is connected to a lever which impinges on the movable guides.

25. The transport device of claim 15 wherein the transfer module has a number of transfer spaces arranged adjacent to each other.

26. The transport device of claim 22 wherein the control installation has at least as many actuators as transfer spaces.

27. The transport device of claim 15 wherein the transfer module is provided with a separating installation for the electronic components.

28. The transport device of claim 15 wherein the loading rail and the transfer module are linked to each other by a transition rail whereby the transition rail includes a convex curve.

29. The transport device of claim 1, further including an unloading device, the unloading device comprising:

a transfer module suitable for taking the components from the pick-up module of the transport device, and a discharge rail suitable for accommodating a number of components;

whereby the transfer module has at least one transfer space for an individual component arranged in such a way that when the transport wheel is in a prescribed position the pick-up space of the pick-up module is opposite the transfer space.

30. The transport device of claim 29 characterized in that the transfer module is provided with a guide channel for the components which has a sliding surface.

31. The transport device of claim 30 characterized in that the guide channel is provided with two guides bordering the sliding surface whereby the guides, at least in the area of the transfer space, are configured to be movable between an initial position and an end position.

32. The transport device of claim 29 characterized in that a pressure source is connected to the transfer module whereby a prescribed pressure can be exerted at the transfer space by means of which the component is retained at the transfer space or is ejected from the transfer space.

33. The transport device of claim 32 characterized in that the sliding surface in the area of the transfer space is provided with an aperture which is connected to the pressure source.

34. The transport device of claim 30 characterized in that the guide channel in the area of the transfer space is provided with a catch which is movable in a direction essentially orthogonal to the sliding surface between a flow position and a blocked position.

35. The transport device of claim 34 characterized in that the catch can be moved from the flow position to the blocked position against the effect of a returning force generated by a spring element.

36. The transport device of claim 29 characterized by a control installation which is provided with at least one actuator whereby the actuator can be operated electrically or pneumatically.

37. The transport device of claim 36 characterized in that the catch can be moved by the actuator between the flow position and the blocked position whereby the actuator is provided with a ram that impinges on the catch.

38. The transport device of claim 36 characterized in that the movable guides of the guide channel can be moved by the actuator between the initial position and the end position whereby the actuator is preferably connected to a lever which impinges on the movable guides.

39. The transport device of claim 29 characterized in that the transfer module has a number of transfer spaces arranged adjacent to each other.

40. The transport device of claim 39 characterized in that the control installation has at least as many actuators as transfer spaces.

41. The transport device of claim 29 characterized in that the discharge rail and the transfer module are linked to each other by a transition rail whereby the transition rail is curved in a concave manner.

* * * * *